US010991573B2

(12) United States Patent
Jia et al.

(10) Patent No.: US 10,991,573 B2
(45) Date of Patent: Apr. 27, 2021

(54) UNIFORM DEPOSITION OF SIOC ON DIELECTRIC AND METAL SURFACES

(71) Applicant: ASM IP Holding BV, Almere (NL)

(72) Inventors: Lingyun Jia, Helsinki (FI); Viljami Pore, Helsinki (FI); Eva Tois, Helsinki (FI); Sun Ja Kim, Helsinki (FI)

(73) Assignee: ASM IP HOLDING B.V., Almere (NL)

( * ) Notice: Subject to any disclaimer, the term of this patent is extended or adjusted under 35 U.S.C. 154(b) by 101 days.

(21) Appl. No.: 16/208,350

(22) Filed: Dec. 3, 2018

(65) Prior Publication Data

US 2019/0172701 A1 Jun. 6, 2019

Related U.S. Application Data

(60) Provisional application No. 62/594,474, filed on Dec. 4, 2017.

(51) Int. Cl.
*H01L 21/02* (2006.01)
*C23C 16/455* (2006.01)
*C23C 16/32* (2006.01)

(52) U.S. Cl.
CPC .......... *H01L 21/0228* (2013.01); *C23C 16/32* (2013.01); *C23C 16/45536* (2013.01);
(Continued)

(58) Field of Classification Search
CPC .......... H01L 21/0228; H01L 21/02126; C23C 16/32
See application file for complete search history.

(56) References Cited

U.S. PATENT DOCUMENTS 3,708,728 A 1/1973 Sterling et al.
3,925,337 A 12/1975 Heiberger
(Continued)

FOREIGN PATENT DOCUMENTS

CN 104900513 9/2015
EP 0387403 9/1990
(Continued)

OTHER PUBLICATIONS

File History of U.S. Appl. No. 16/811,258, filed Mar. 6, 2020.
(Continued)

*Primary Examiner* — Errol V Fernandes
(74) *Attorney, Agent, or Firm* — Knobbe, Martens, Olson & Bear LLP

(57) ABSTRACT

Plasma enhanced atomic layer deposition (PEALD) processes for simultaneously depositing SiOC on two or more different surfaces of a substrate are provided. For example, SiOC may be deposited simultaneously on a first dielectric surface and a second metal or metallic surface. The PEALD processes can comprise two or more deposition cycles for forming SiOC on the two surfaces. The deposition cycles may comprise alternately and sequentially contacting the substrate with a first precursor comprising silicon and a second plasma reactant, such as an Ar/H$_2$ plasma. In some embodiments, a PEALD process further comprises contacting the substrate with a plasma reactant prior to beginning the deposition cycle. In some embodiments, the deposition cycle is repeated more than 500 times and a uniform SiOC film may be formed on the two different surfaces.

20 Claims, 3 Drawing Sheets

(52) U.S. Cl.
CPC .. *C23C 16/45553* (2013.01); *H01L 21/02126* (2013.01); *H01L 21/02216* (2013.01); *H01L 21/02274* (2013.01)

(56) References Cited

U.S. PATENT DOCUMENTS

| | | | |
|---|---|---|---|
| 4,058,430 A | 11/1977 | Suntola et al. | |
| 4,282,267 A | 8/1981 | Küyel | |
| 4,389,973 A | 6/1983 | Suntola et al. | |
| 4,565,747 A | 1/1986 | Nakae et al. | |
| 4,747,367 A | 5/1988 | Posa | |
| 4,761,269 A | 8/1988 | Conger et al. | |
| 4,767,494 A | 8/1988 | Kobayashi | |
| 4,851,095 A | 7/1989 | Scobey et al. | |
| 4,935,661 A | 6/1990 | Heinecke et al. | |
| 5,071,670 A | 12/1991 | Kelly | |
| 5,166,092 A | 11/1992 | Mochizuki et al. | |
| 5,221,556 A | 6/1993 | Hawkins et al. | |
| 5,270,247 A | 12/1993 | Sakuma et al. | |
| 5,281,274 A | 1/1994 | Yoder | |
| 5,306,666 A | 4/1994 | Izumi | |
| 5,316,793 A | 5/1994 | Wallace et al. | |
| 5,342,652 A | 8/1994 | Foster et al. | |
| 5,482,262 A | 1/1996 | Hayakawa et al. | |
| 5,595,784 A | 1/1997 | Kaim et al. | |
| 5,603,771 A | 2/1997 | Seiberras et al. | |
| 5,618,395 A | 4/1997 | Gartner | |
| 5,691,235 A | 11/1997 | Meikle et al. | |
| 5,693,139 A | 12/1997 | Nishizawa et al. | |
| 5,711,811 A | 1/1998 | Suntola et al. | |
| 5,723,384 A | 3/1998 | Park et al. | |
| 5,744,254 A | 4/1998 | Kampe et al. | |
| 5,769,950 A | 6/1998 | Takasu et al. | |
| 5,789,024 A | 8/1998 | Levy et al. | |
| 5,855,680 A | 1/1999 | Soininen | |
| 5,916,365 A | 6/1999 | Sherman | |
| 5,946,598 A | 8/1999 | Yeh | |
| 5,947,710 A | 9/1999 | Cooper et al. | |
| 5,964,943 A | 10/1999 | Stein et al. | |
| 5,965,004 A | 10/1999 | Cowley et al. | |
| 5,972,430 A | 10/1999 | DiMeo et al. | |
| 5,973,400 A | 10/1999 | Murakami et al. | |
| 6,006,763 A | 12/1999 | Mori et al. | |
| 6,015,590 A | 1/2000 | Suntola et al. | |
| 6,087,257 A | 7/2000 | Park et al. | |
| 6,099,904 A | 8/2000 | Mak et al. | |
| 6,104,074 A | 8/2000 | Chen | |
| 6,113,977 A | 9/2000 | Soininen et al. | |
| 6,124,158 A | 9/2000 | Dautartas et al. | |
| 6,139,624 A | 10/2000 | Rupp | |
| 6,139,700 A | 10/2000 | Kang et al. | |
| 6,144,060 A | 11/2000 | Park et al. | |
| 6,156,382 A | 12/2000 | Rajagopalan et al. | |
| 6,159,871 A | 12/2000 | Loboda et al. | |
| 6,162,501 A | 12/2000 | Kim | |
| 6,174,809 B1 | 1/2001 | Kang et al. | |
| 6,188,134 B1 | 2/2001 | Stumborg et al. | |
| 6,194,310 B1 | 2/2001 | Hsu et al. | |
| 6,200,389 B1 | 3/2001 | Miller et al. | |
| 6,203,613 B1 | 3/2001 | Gates et al. | |
| 6,206,967 B1 | 3/2001 | Mak et al. | |
| 6,234,646 B1 | 5/2001 | Ito | |
| 6,270,572 B1 | 8/2001 | Kim et al. | |
| 6,284,646 B1 | 9/2001 | Leem | |
| 6,287,965 B1 | 9/2001 | Kang et al. | |
| 6,342,277 B1 | 1/2002 | Sherman | |
| 6,355,561 B1 | 3/2002 | Sandhu et al. | |
| 6,380,627 B1 | 4/2002 | Weihs et al. | |
| 6,391,785 B1 | 5/2002 | Satta et al. | |
| 6,410,462 B1 | 6/2002 | Yang et al. | |
| 6,416,577 B1 | 7/2002 | Suntola et al. | |
| 6,464,779 B1 | 10/2002 | Powell et al. | |
| 6,475,276 B1 | 11/2002 | Elers et al. | |
| 6,482,262 B1 | 11/2002 | Elers et al. | |
| 6,482,733 B2 | 11/2002 | Raaijmakers et al. | |
| 6,482,740 B2 | 11/2002 | Soininen et al. | |
| 6,511,539 B1 | 1/2003 | Raaijmakers | |
| 6,534,395 B2 | 3/2003 | Werkhoven et al. | |
| 6,576,053 B1 | 6/2003 | Kim et al. | |
| 6,583,048 B1 | 6/2003 | Vincent et al. | |
| 6,599,572 B2 | 7/2003 | Saanila et al. | |
| 6,613,383 B1 | 9/2003 | George et al. | |
| 6,616,982 B2 | 9/2003 | Merrill et al. | |
| 6,632,595 B2 | 10/2003 | Kikuchi et al. | |
| 6,652,924 B2 | 11/2003 | Sherman | |
| 6,706,115 B2 | 3/2004 | Leskela et al. | |
| 6,727,169 B1 | 4/2004 | Raaijmakers et al. | |
| 6,780,704 B1 | 8/2004 | Raaijmakers et al. | |
| 6,794,287 B2 | 9/2004 | Saanila et al. | |
| 6,797,340 B2 | 9/2004 | Fang et al. | |
| 6,800,383 B1 | 10/2004 | Lakhotkin | |
| 6,800,552 B2 | 10/2004 | Elers et al. | |
| 6,809,026 B2 | 10/2004 | Yoon et al. | |
| 6,821,889 B2 | 11/2004 | Elers et al. | |
| 6,827,978 B2 | 12/2004 | Yoon et al. | |
| 6,833,161 B2 | 12/2004 | Wang et al. | |
| 6,863,727 B1 | 3/2005 | Elers et al. | |
| 6,902,763 B1 | 6/2005 | Elers et al. | |
| 6,986,914 B2 | 1/2006 | Elers et al. | |
| 7,015,153 B1 | 3/2006 | Triyoso et al. | |
| 7,045,406 B2 | 5/2006 | Huotari et al. | |
| 7,074,690 B1 | 7/2006 | Gauri et al. | |
| 7,115,534 B2 | 10/2006 | Nguyen et al. | |
| 7,115,974 B2 | 10/2006 | Wu et al. | |
| 7,138,336 B2 | 11/2006 | Lee et al. | |
| 7,211,144 B2 | 5/2007 | Lu et al. | |
| 7,211,508 B2 | 5/2007 | Chung et al. | |
| 7,268,078 B2 | 9/2007 | Iyer | |
| 7,329,590 B2 | 2/2008 | Elers et al. | |
| 7,405,158 B2 | 7/2008 | Lai et al. | |
| 7,410,666 B2 | 8/2008 | Elers et al. | |
| 7,416,981 B2 | 8/2008 | Lee et al. | |
| 7,611,751 B2 | 11/2009 | Elers | |
| 7,749,871 B2 | 7/2010 | Elers et al. | |
| 7,776,396 B2 | 8/2010 | Kobrin et al. | |
| 7,794,798 B2 | 9/2010 | Hautala | |
| 7,824,492 B2 | 11/2010 | Tois et al. | |
| 8,217,446 B2 | 7/2012 | Fukuzumi et al. | |
| 8,703,624 B2 | 4/2014 | Yang et al. | |
| 9,111,746 B2 | 8/2015 | Ranjan et al. | |
| 9,171,736 B2 | 10/2015 | Raley et al. | |
| 9,243,324 B2 | 1/2016 | Bowen et al. | |
| 9,425,038 B2 | 8/2016 | Shimizu | |
| 9,425,097 B1 * | 8/2016 | Bouche | H01L 21/31051 |
| 9,443,718 B2 | 9/2016 | Harada et al. | |
| 9,455,138 B1 | 9/2016 | Fukazawa et al. | |
| 9,472,391 B2 | 10/2016 | Shimamoto et al. | |
| 9,784,695 B2 | 10/2017 | Blendl | |
| 9,786,491 B2 | 10/2017 | Suzuki et al. | |
| 9,786,492 B2 | 10/2017 | Suzuki et al. | |
| 10,424,476 B2 | 9/2019 | Suzuki et al. | |
| 10,424,477 B2 | 9/2019 | Niskanen et al. | |
| 10,453,675 B2 | 10/2019 | O'Neill | |
| 10,600,637 B2 | 3/2020 | Suzuki et al. | |
| 10,787,591 B2 | 9/2020 | Tsotsis et al. | |
| 2001/0004479 A1 | 6/2001 | Cheung et al. | |
| 2001/0005546 A1 | 6/2001 | Cheung et al. | |
| 2001/0024387 A1 | 9/2001 | Raaijmakers et al. | |
| 2001/0034097 A1 | 10/2001 | Lim et al. | |
| 2001/0041250 A1 | 11/2001 | Werkhoven et al. | |
| 2002/0004293 A1 | 1/2002 | Soininen et al. | |
| 2002/0104481 A1 | 8/2002 | Chiang et al. | |
| 2002/0182320 A1 | 12/2002 | Leskela et al. | |
| 2003/0015764 A1 | 1/2003 | Raaijmakers | |
| 2003/0026989 A1 | 2/2003 | George et al. | |
| 2003/0031793 A1 | 2/2003 | Chang et al. | |
| 2003/0049931 A1 | 3/2003 | Byun et al. | |
| 2003/0072975 A1 | 4/2003 | Shero et al. | |
| 2003/0082296 A1 | 5/2003 | Elers et al. | |
| 2003/0104126 A1 | 6/2003 | Fang et al. | |
| 2003/0119305 A1 | 6/2003 | Huang et al. | |
| 2003/0123216 A1 | 7/2003 | Yoon et al. | |
| 2003/0127043 A1 | 7/2003 | Lu et al. | |
| 2003/0153181 A1 | 8/2003 | Yoon et al. | |

(56) References Cited

U.S. PATENT DOCUMENTS

| | | |
|---|---|---|
| 2003/0157760 A1 | 8/2003 | Xi et al. |
| 2003/0161952 A1 | 8/2003 | Wang et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2004/0130029 A1 | 7/2004 | Raaijmakers et al. |
| 2004/0185183 A1 | 9/2004 | Srinivasan et al. |
| 2004/0206008 A1 | 10/2004 | Sung |
| 2004/0208994 A1 | 10/2004 | Harkonen et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2004/0240820 A1 | 12/2004 | Johnson et al. |
| 2005/0037557 A1 | 2/2005 | Doczy et al. |
| 2005/0106877 A1 | 5/2005 | Elers et al. |
| 2005/0215008 A1 | 9/2005 | Orlowski et al. |
| 2005/0236694 A1 | 10/2005 | Wu et al. |
| 2005/0271813 A1 | 12/2005 | Kher et al. |
| 2006/0019494 A1 | 1/2006 | Cao et al. |
| 2006/0078679 A1 | 4/2006 | Elers et al. |
| 2006/0079090 A1 | 4/2006 | Elers et al. |
| 2006/0079099 A1 | 4/2006 | Nguyen et al. |
| 2006/0165892 A1 | 7/2006 | Weidman |
| 2006/0211224 A1 | 9/2006 | Matsuda et al. |
| 2006/0223300 A1 | 10/2006 | Simka et al. |
| 2006/0240187 A1 | 10/2006 | Weidman |
| 2007/0054046 A1 | 3/2007 | Ishizaka et al. |
| 2007/0072427 A1* | 3/2007 | Fukushima .............. C09G 1/02 438/692 |
| 2007/0148350 A1 | 6/2007 | Rahtu et al. |
| 2007/0218670 A1 | 9/2007 | Ishizaka |
| 2007/0232082 A1 | 10/2007 | Balseanu et al. |
| 2007/0251444 A1 | 11/2007 | Gros-Jean et al. |
| 2008/0081470 A1 | 4/2008 | Clark |
| 2008/0102204 A1 | 5/2008 | Elers |
| 2008/0102613 A1 | 5/2008 | Elers |
| 2008/0113110 A1 | 5/2008 | Elers et al. |
| 2008/0182411 A1 | 7/2008 | Elers |
| 2008/0274617 A1 | 11/2008 | Milligan |
| 2009/0081868 A1 | 3/2009 | Shah et al. |
| 2009/0104791 A1 | 4/2009 | Nemani |
| 2009/0211526 A1 | 8/2009 | Tanaka et al. |
| 2009/0315093 A1 | 12/2009 | Li et al. |
| 2010/0092781 A1 | 4/2010 | Zambov et al. |
| 2010/0148903 A1 | 6/2010 | Yin et al. |
| 2010/0239742 A1 | 9/2010 | Larson-Smith et al. |
| 2010/0297545 A1 | 11/2010 | Yoo et al. |
| 2011/0159202 A1 | 6/2011 | Matsushita et al. |
| 2011/0262642 A1 | 10/2011 | Xiao et al. |
| 2011/0278533 A1 | 11/2011 | Hillhouse et al. |
| 2012/0003831 A1 | 1/2012 | Kang et al. |
| 2012/0119283 A1 | 5/2012 | Lee et al. |
| 2012/0141770 A1 | 6/2012 | Cadet et al. |
| 2012/0208347 A1 | 8/2012 | Hwang et al. |
| 2012/0269962 A1 | 10/2012 | Blomberg et al. |
| 2013/0078454 A1 | 3/2013 | Thompson et al. |
| 2013/0084714 A1* | 4/2013 | Oka ................. H01L 21/02126 438/765 |
| 2013/0112605 A1 | 5/2013 | Wyndham et al. |
| 2013/0115763 A1 | 5/2013 | Takamure et al. |
| 2013/0134372 A1 | 5/2013 | Sakuma et al. |
| 2013/0196082 A1 | 8/2013 | Spence |
| 2013/0330935 A1 | 12/2013 | Varadarajan |
| 2014/0030432 A1 | 1/2014 | Leu et al. |
| 2014/0048131 A1 | 2/2014 | Tanaka et al. |
| 2014/0272194 A1 | 9/2014 | Xiao et al. |
| 2014/0273477 A1 | 9/2014 | Niskanen et al. |
| 2014/0295109 A1 | 10/2014 | Sakakura |
| 2014/0302267 A1 | 10/2014 | Wynne et al. |
| 2014/0349107 A1 | 11/2014 | Thoumazet et al. |
| 2014/0367764 A1 | 12/2014 | Lee et al. |
| 2015/0087156 A1 | 3/2015 | Kamimura et al. |
| 2015/0118865 A1 | 4/2015 | Shimizu |
| 2015/0214103 A1 | 7/2015 | Matsuda |
| 2015/0217240 A1 | 8/2015 | Van Tuel et al. |
| 2015/0217330 A1 | 8/2015 | Haukka et al. |
| 2015/0252477 A1 | 9/2015 | Nguyen et al. |
| 2015/0275355 A1 | 10/2015 | Mallikarjunan et al. |
| 2015/0303056 A1 | 10/2015 | Varadarajan et al. |
| 2015/0303101 A1 | 10/2015 | Blomberg et al. |
| 2015/0376211 A1 | 12/2015 | Girard et al. |
| 2015/0380302 A1 | 12/2015 | Mountsier et al. |
| 2016/0064281 A1 | 3/2016 | Izumi et al. |
| 2016/0093485 A1 | 3/2016 | Kobayashi et al. |
| 2016/0225616 A1 | 8/2016 | Li et al. |
| 2016/0336338 A1 | 11/2016 | Song et al. |
| 2017/0140924 A1 | 5/2017 | Suzuki et al. |
| 2017/0213726 A1 | 7/2017 | Saley et al. |
| 2017/0309476 A1 | 10/2017 | Venkatasubramanian et al. |
| 2017/0323782 A1 | 11/2017 | Suzuki et al. |
| 2017/0352680 A1 | 12/2017 | Shin et al. |
| 2017/0365462 A1 | 12/2017 | Varadarajan |
| 2018/0005814 A1 | 1/2018 | Kumar et al. |
| 2018/0013078 A1 | 1/2018 | Lee et al. |
| 2018/0122742 A1 | 5/2018 | Ha et al. |
| 2018/0151355 A1 | 5/2018 | Fukazawa |
| 2018/0182618 A1 | 6/2018 | Blanquart et al. |
| 2018/0350587 A1 | 12/2018 | Jia et al. |

FOREIGN PATENT DOCUMENTS

| | | |
|---|---|---|
| EP | 0394054 | 10/1990 |
| EP | 0442490 | 8/1991 |
| EP | 0526779 | 2/1993 |
| EP | 0528779 | 2/1993 |
| EP | 0573033 | 12/1993 |
| EP | 0774533 | 5/1997 |
| EP | 0899779 | 3/1999 |
| EP | 1158070 | 11/2001 |
| EP | 1167567 | 1/2002 |
| EP | 2620440 | 7/2013 |
| EP | 3196336 | 7/2017 |
| JP | 58-033841 | 2/1983 |
| JP | H06-037041 | 2/1994 |
| JP | H06-069157 | 3/1994 |
| JP | H07-230957 | 8/1995 |
| JP | H08-264530 | 10/1996 |
| JP | H0955365 | 2/1997 |
| JP | 09-087857 | 3/1997 |
| JP | 2003342731 | 12/2003 |
| JP | 2004-288979 | 10/2004 |
| JP | 2006-040936 | 2/2006 |
| JP | 2009-083511 | 4/2009 |
| JP | 2010219533 | 9/2010 |
| JP | 2014135475 | 7/2014 |
| JP | 2014229834 | 12/2014 |
| JP | 2015523917 | 8/2015 |
| KR | 2003-0016346 | 2/2003 |
| KR | 2003-0057938 | 7/2003 |
| KR | 2003-0093575 | 12/2003 |
| KR | 2004-0060402 | 7/2004 |
| KR | 2004-0079173 | 9/2004 |
| KR | 2004-0079175 | 9/2004 |
| KR | 2004-0100767 | 12/2004 |
| KR | 2005-0000168 | 1/2005 |
| KR | 2018-005128 | 1/2018 |
| TW | 2010210202 | 1/2010 |
| TW | 201403759 | 1/2014 |
| WO | WO 96/17107 | 6/1996 |
| WO | WO 96/18756 | 6/1996 |
| WO | WO 98/51838 | 11/1998 |
| WO | WO 99/37655 | 7/1999 |
| WO | WO 00/01006 | 1/2000 |
| WO | WO 00/04704 | 1/2000 |
| WO | WO 00/40772 | 7/2000 |
| WO | WO 00/47404 | 8/2000 |
| WO | WO 00/47796 | 8/2000 |
| WO | WO 00/54320 | 9/2000 |
| WO | WO 00/55895 | 9/2000 |
| WO | WO 00/63957 | 10/2000 |
| WO | WO 01/27347 | 4/2001 |
| WO | WO 01/29280 | 4/2001 |
| WO | WO 01/29891 | 4/2001 |
| WO | WO 01/29893 | 4/2001 |

(56) References Cited

FOREIGN PATENT DOCUMENTS

| WO | WO 01/53565 | 7/2001 |
|---|---|---|
| WO | WO 01/66832 | 9/2001 |
| WO | WO 01/78213 | 10/2001 |
| WO | WO 01/88972 | 11/2001 |
| WO | WO 2004/077515 | 9/2004 |
| WO | WO 2006/080782 | 8/2006 |
| WO | WO 2006/097525 | 9/2006 |
| WO | WO 2007/041089 | 4/2007 |
| WO | WO 2008/051851 | 5/2008 |
| WO | WO 2008/121478 | 10/2008 |
| WO | WO 2008/137399 | 11/2008 |
| WO | WO 2018/204709 | 11/2018 |
| WO | WO 2018/213018 | 11/2018 |

OTHER PUBLICATIONS

1988RD-0296076 (Nov. 20, 1998), Field effect transistor structure with improved transconductant—contg. spacer-less conducting gate oxide, and tungsten deposited on source and drain, East Version 2.0.1.4 Patent-Assignee: Anonymous[Anon], Sep. 19, 2005.
Aarik et al., "Influence of substrate temperature on atomic layer growth and properties of HfO2 thin films", Thin Solid Films, vol. 340, 1999, pp. 110-116.
Alen et al., "Atomic Layer Deposition of Ta(Al)N(C) Thin Films Using Trimethylaluminum as a Reducing Agent", Journal of the Electrochemical Society, vol. 148, No. 10, pp. G566-G571, 2001.
Andricacos et al., Damascene copper electroplating for chip, IBM Jour. Research and Dev., 1998, vol. 42, Issue 5, pp. 567-574.
Bain et al., Deposition of tungsten by plasma enhanced chemical vapour deposition, J. Phys. IV France, 1999, vol. 9, pp. 827-833.
Chang et al, "Chemical Vapor Deposition of Tantalum Carbide and Carbonitride Thin Films from Me3CE=Ta(CH2CMe3)3 (E = CH, N)," J. Mater. Chem. 13:365-369 (2003).
Chookarjorn et al, "Design of Stable Nanocrystalline Alloys," Science Magazine, vol. 337, pp. 951-954, Aug. 24, 2012.
Closser et al., "Molecular Layer Deposition of a Highly Stable Oxycarbide Thin Film Using an Organic Chlorosilane and Water", ACS Appl. Mater. Interfaces 2018, 10, pp. 24266-24274.
Elers et al., NbC15 as a precursor in atomic layer epitaxy, Applied Surface Science, Jul. 9, 1994, vol. 82/83, pp. 468-474.
Favis et al., Atomic layer epitaxy of silicon, silicon/germanium and silicon carbide via extraction/exchange processes, Avail. NTIS. Report, 1991, pp. 33.
File History of U.S. Appl. No. 14/939,984, filed Nov. 12, 2015.
File History of U.S. Appl. No. 15/707,749, filed Sep. 18, 2017.
File History of U.S. Appl. No. 15/707,878, filed Sep. 18, 2017.
File History of U.S. Appl. No. 15/588,026, filed May 5, 2017.
File History of U.S. Appl. No. 15/787,342, filed Oct. 18, 2017.
File History of U.S. Appl. No. 15/951,626, filed Apr. 12, 2018.
File History of U.S. Appl. No. 15/951,644, filed Apr. 12, 2018.
Fuyuki et al., Atomic layer epitaxy controlled by surface superstructures in silicon carbide, Thin Solid Films, 1993, vol. 225, Issue 1-2, pp. 225-229.
Fuyuki et al., Atomic layer epitaxy of cubic silicon carbide by gas source MBE using surface superstructure, J. Cryst. Growth, 1989, vol. 95, Issue 1-4, pp. 461-463.
Gallis et al., "White light emission from amorphous silicon oxycarbide (a-SiCxOy) thin films: Role of composition and postdeposition annealing", Applied Physics Letters 97, 2010, pp. 0810905-1-0810905-3.
Girolami et al., Tailored Organometallics as Low-Temperature CVD Precursors to Thin Films, Materials Research Society Symposium Proceedings, 1988, vol. 121, pp. 429-438.
Gordon et al., "A Kinetic Model for Step Coverage by Atomic Layer Deposition in Narrow Holes or Trenches", Chemical Vapor Deposition, 2003, vol. 9, No. 2, pp. 73-78.
Hara et al., Atomic layer control of .beta.-silicon carbide (001) surface, Springer Proc. Phys., 1992, pp. 90-95.

Hiltunen et al., Nitrides of titanium, niobium, tantalum and molybdenum grown as thin films by the atomic layer epitaxy method, Thin Solid Films, 1988, vol. 166, pp. 149-154.
Hultman et al., "Review of the Thermal and Mechanical Stability of TiN-based Thin Films" Zeitscrift Fur Metallkunde 90 (10): 803-813 (1999).
Ihanus et al., "ALE growth of ZnS1-xSex thin films by substituting surface sulfur with elemental selenium," Appl. Surface Sci., 112:154-158 (1997).
International Search Report and Written Opinion dated Apr. 7, 2008, Application No. PCT/US2007/082131.
International Search Report and Written Opinion dated Jun. 25, 2015 in Application No. PCT/US2015/023492.
Jehn et al., Gmelin Handbook of Inorganic and Organometallic Chemistry, 8th Edition, 1993, vol. A 5b, Issue 54, pp. 131-154.
Jeon et al., A Study on the Characteristics of TiN Thin Film Deposited by Atomic Layer Chemical Vapor Deposition Method, J. Vac. Sci. Technol. A, 2000, vol. 18, Issue 4, pp. 1595-1598.
Juppo et al., Deposition of copper films by an alternate supply of CuCl and Zn, J. Vac. Sci. Technol A, Jul./Aug. 1997, vol. 15, Issue 4, pp. 2330-2333.
Kattelus et al., "Electrical Properties of Tantalum Based Composite Oxide Films," Mat. Res. Soc. Symp. Proc. vol. 284, pp. 511-516 (1993).
Kattelus et al., "Layered tantalum-aluminum oxide films deposited by atomic layer epitaxy," Thin Solid Films, Vo. 225, pp. 296-298 (1993).
Kim et al., Atomic-layer-deposited WNxCy thin films as diffusion barrier for copper metallization, Applied Physics Letters, Jun. 23, 2003, vol. 82, Issue 25, pp. 4486-4488.
Kim et al., "Novel capacitor technology for high density stand-alone and embedded DRAMs," IEEE International Electron Devices Meeting, IEDM (2000).
Kirk-Othmer, Encyclopedia of Chemical Technology, John Wiley & Sons, Inc., 1992, vol. 4, pp. 841-878.
Klaus et al., Atomic Layer Deposition of Tungsten Nitride Films Using Sequential Surface Reactions, Journal of the Electrochemical Society, 2000, vol. 147, Issue 3, pp. 1175-1181.
Klaus et al., Atomic layer deposition of tungsten using sequential surface chemistry with a sacrificial stripping reaction, Thin Solid Films, 2000, vol. 360, pp. 145-153.
Klaus et al., Atomic layer deposition of tungsten and tungsten nitride using sequential surface reactions, AVS 46th International Symposium, 1999, Seattle, WA, US.
Klaus et al., Atomically controlled growth of tungsten and tungsten nitride using sequential surface reactions, Applied Surface Science, 2000, vol. 162-163, pp. 479-491.
Kukli et al., Properties of (Nb1-xTax)2O5 Solid Solutions and (Nb1-xTax)2O5-ZrO2 Nanolaminates Growth by Atomic Layer Epitaxy, NanoStructured Materials, 1997, vol. 8, pp. 785-793.
Lai et al., Precursors for Organometallic Chemical Vapor Deposition of Tungsten Carbide Films, Chem. Mater., 1995, vol. 7, pp. 2284-2292.
Lakomaa et al., "Surface reactions in Al2O3 growth from trimethylaluminum and water by atomic layer epitaxy," Applied Surface Science, vol. 107, pp. 107-115 (1996).
Lee et al., "Characteristics of low-k SiOC films deposited via atomic layer deposition", Thin Solid Films 645 (2018), pp. 334-339.
Leskelä et al., ALD precursor chemistry: Evolution and future challenges, Jour. Phys. IV France 9, 1999, pp. 837-852.
Ludviksson et al., Low-Temperature Thermal CVD of Ti-Al Metal Films Using a Strong Reducing Agent, Chem. Vap. Deposition, 1998, vol. 4, Issue 4, pp. 129-132.
Martensson, Use of atomic layer epitaxy for fabrication of Si/TiN/Cu structures, J. Vac. Sci. Technol. B, Sep./Oct. 1999, vol. 17, Issue 5, pp. 2122-2128.
Martensson et al., Atomic Layer Epitaxy of Copper and Tantalum, Chemical Vapor Deposition, 1997, vol. 3, Issue 1, pp. 45-50.
Martensson et al., CU(THD)2 As Copper Source in Atomic Layer Epitaxy, Electrochemical Society Proceedings, vol. 97-25, (1997) pp. 1529-1536.
Matsunami et al., Hetero-interface control and atomic layer epitaxy of SiC, Applied Surface Science, 1997, vol. 112, pp. 171-175.

(56) References Cited

OTHER PUBLICATIONS

Min et al., Atomic Layer Deposition of TiN Films by Alternate Supply of Tetrakis (ethylmethylamino)- Titanium and Ammonia, Jpn. J. Appl. Phys., 1998, vol. 37, pp. 4999-5004.
Min et al., Atomic Layer Deposition of TiN Thin Films by Sequential Introduction of Ti Precursor and HN3, Mat. Res. Soc. Symp. Proc., 1998, vol. 514, pp. 337-342.
Nakajima et al., Chemical Vapor Deposition of Tungsten Carbide, Molybdenum Carbide Nitride, and Molybdenum Nitride Films, J. Electrochem. Soc., Jun. 1997, vol. 144, Issue 6, pp. 2096-2100.
Polyakov et al., Growth of GaBN Ternary Solutions by Organometallic Vapor Phase Epitaxy, Journal of Electronic Materials, 1997, vol. 26, Issue 3, pp. 237-242.
Ritala et al., Atomic layer epitaxy growth of TiN thin films, J. Electrochem. Soc., 1995, vol. 142, Issue 8, pp. 2731-2737.
Ritala et al., Atomic Layer Epitaxy Growth of TiN Thin Films from TiI4 and NH3, J. Electrochem. Soc., Aug. 1998, vol. 145, Issue 8, pp. 2914-2920.
Ritala et al., "Controlled Growth of TaN, Ta3N5, and TaOxNy Thin Films by Atomic Layer Deposition", Chem. Mater., 1999, vol. 11, pp. 1712-1718.
Ritala et al., Effects of intermediate zinc pulses on properties of TiN and NbN films deposited by atomic layer epitaxy, Appl. Surf. Sci., 1997, vol. 120, pp. 199-212.
Ritala et al., Perfectly conformal TiN and Al2O3 films deposited by atomic layer deposition, Chem. Vapor Deposition, 1999, vol. 5, pp. 7-9.
Ritala et al., Surface roughness reduction in atomic layer epitaxy grown of titanium dioxide thin films, Thin Solid Films, vol. 249, pp. 155-162 (1994).
Sadayuki et al., Sub-atomic layer growth of SiC at low temperatures, Japanese Journal of Applied Physics, 1995, vol. 34, Issue 11, pp. 6166-6170.
Sherman et al., Plasma enhanced atomic layer deposition of Ta for diffusion barrier applications, AVS 46th International Symposium, Oct. 26, 1999, Seattle, WA, US.
Song et al., "Formation of Tantalum Carbide and Nitride Phases in Atomic Layer Deposition Using Hydrogen Plasm and tert-Butylimido-tris(diethylamido)-tantalum (TBTDET), and its Effect on Material Properties", Chemical Vapor Deposition, 2008, vol. 14, pp. 334-338.
Suntola, "Atomic Layer Epitaxy," Handbook of Crystal Growth 3, Ch. 14, pp. 601-663 (1994).
Teo et al., "Pre-treatments applied to oxidized aluminum surfaces to modify the interfacial bonding with bis-1, 2-(triethoxysilyl) ethane (BTSE)—Part I. High-purity Al with native oxide", Applied Surface Science 252(5), 2005, pp. 1293-1304.
Teo et al., "Pre-treatments applied to oxidized aluminum surfaces to modify the interfacial bonding with bis-1,2-(triethoxysilyl) ethane (BTSE)—Part II. Anodized 7075-T6 Al alloy", Applied Surface Science 252(5), 2005, pp. 1305-1312.
Tulhoff et al., Ullmann's Encyclopedia of Industrial Chemistry, 5th, Completely Revised Edition, 1986, vol. A5, pp. 61-77.
U.S. Appl. No. 10/049,125, filed Aug. 20, 2002 including prosecution history, including but not limited to, Office Action dated Apr. 8, 2004, Office Action dated Jun. 18, 2003, and Office Action dated Oct. 27, 2003.
U.S. Appl. No. 10/242,368, filed Sep. 12, 2002 including prosecution history, including but not limited to, Office Action dated Oct. 20, 2004, Office Action dated Apr. 27, 2004, and Notice of Allowance dated Jul. 19, 2005.
U.S. Appl. No. 10/969,297, filed Oct. 19, 2004 including prosecution history, including but not limited to, Office Action dated Oct. 11, 2006, Office Action dated Apr. 12, 2007, and Notice of Allowance dated Sep. 18, 2007.
U.S. Appl. No. 11/286,203, filed Nov. 22, 2005 including prosecution history, including but not limited to Office Action dated Sep. 28, 2007.
U.S. Appl. No. 11/288,872, filed Nov. 28, 2005 including prosecution history, including but not limited to, Office Action dated Jul. 2, 2007, Office Action dated Jan. 30, 2008, Office Action dated Sep. 9, 2008, Office Action dated Dec. 4, 2008, and Office Action dated Aug. 20, 2009.
U.S. Appl. No. 11/591,845, filed Nov. 1, 2006 including prosecution history, including but not limited to, Office Action dated Sep. 4, 2008, Office Action dated May 28, 2009, and Notice of Allowance dated Sep. 4, 2009.
U.S. Appl. No. 14/939,984, filed Nov. 12, 2015 including prosecution history, including but not limited to, Office Action dated Feb. 3, 2017, and Notice of Allowance dated Jun. 7, 2017.
U.S. Appl. No. 15/342,943, filed Nov. 3, 2016 including prosecution history, including but not limited to Notice of Allowance dated Jun. 13, 2017.
U.S. Appl. No. 14/255,799, filed Apr. 17, 2014 including prosecution history, including but not limited to, Office Action dated Dec. 1, 2016, Final Office Action dated Aug. 29, 2017, and Advisory Action dated Dec. 21, 2017.
Utriainen et al., "Controlled Electrical Conductivity in SnO2 Thin Films by Oxygen or Hydrocarbon Assisted Atomic Layer Epitaxy," J. Electrochem. Soc. 146(1):189-193 (1999).
Wong et al., Barriers for copper interconnections, Solid State Technology, 1999, pp. 1-7.
Wrobel et al., "Silicon Oxycarbide Films Produced by Remote Microwave Hydrogen Plasma CVD using a Tetramethyldisiloxane Precursor: Growth Kinetics, Structure, Surface Morphology, and Properties", Chem. Vap. Deposition 2015, 21, pp. 307-318.
Yang et al., Atomic Layer Deposition of Tungsten Film from WF6/B2H6: Nucleation Layer for Advanced Semiconductor Devices, Advanced Metallization Conference 2001 (AMC 2001), Conference Proceedings ULSI XVII@2002 Materials Research Society, 2001, pp. 655-660.
Zhang et al., "High permittivity thin film nanolaminates," Journal of Applied Physics, vol. 87, No. 4, pp. 1921-1924 (2000).
Amano et al., "Improved brushing durability of titanium dioxide coating on polymethyl methacrylate substrate by prior treatment with acryloxypropyl trimethoxysilane-based agent for denture application", Dental Materials Journal 2010, 29(1): pp. 97-103.
Diaz-Benito et al., "Hydrolysis study of bis-1,2-(triethoxylsilyl)ethane silane by NMR", Colloids and Surfaces A; Physicochemical and Engineering Aspects, 369 (2010), pp. 53-56.
Ibrahim et al., "Organosilica bis(triethoxysilypethane (BTESE) membranes for gas permeation (GS) and reverse osmosis (RO): The effect of preparation conditions on structure, and the correlation between gas and liquid permeation properties", Journal of Membrane Science, 526 (2017), pp. 242-251.
Wahab et al., "Hybrid periodic mesoporous organosilica materials prepared from 1,2-bis(triethoxysilyl)ethane and (3-cyanopropyl)triethoxysilane", Microporous and Mesoporous Materials 69 (2004), pp. 19-27.
File History of U.S. Appl. No. 16/576,328, filed Sep. 19, 2019.
File History of U.S. Appl. No. 16/603,555, filed Oct. 7, 2019.
File History of U.S. Appl. No. 17/072,480, filed Oct. 16, 2020.

\* cited by examiner

UNIFORM DEPOSITION OF SIOC ON DIELECTRIC AND METAL SURFACES

CROSS-REFERENCE TO RELATED APPLICATIONS

The present application claims priority to U.S. provisional application No. 62/594,474, filed Dec. 4, 2017, which is incorporated herein by reference in its entirety.

BACKGROUND

Field of the Invention

The present application relates generally to plasma enhanced atomic layer deposition (PEALD) of silicon oxide carbide (SiOC).

Description of Related Art

In the semiconductor industry, there is a need to deposit low-K spacers (LKS) on different substrate surfaces with good uniformity. These different surfaces can constitute different materials, for example a metal and a dielectric. Uniform deposition of one material on two or more different substrate surfaces could be beneficial, for example by reducing the number of steps in device fabrication. There is also a need for dielectric materials with low dielectric constant (k) values and low etch rates, for example in acid-based etching solutions such as HF.

SUMMARY

In accordance with one aspect, plasma enhanced atomic layer deposition (PEALD) processes for depositing SiOC on two or more different surfaces of a substrate are provided. In some embodiments the PEALD processes can comprise providing a substrate comprising a first surface and a second surface, where the first surface comprises a different material from the second surface, and conducting two or more deposition cycles for forming SiOC on the two surfaces. The deposition cycles may comprise alternately and sequentially contacting the substrate with a first precursor comprising silicon and a second plasma reactant. In some embodiments, a PEALD process further comprises contacting the substrate with a plasma reactant prior to beginning the deposition cycle. In some embodiments, the deposition cycle is repeated more than 500 times. In some embodiments, the SiOC film is deposited uniformly on the first surface and second surface. In some embodiments, the SiOC film has a k value of less than 4.

In some embodiments, the first surface is a metal surface and the second surface is a dielectric surface. In some embodiments, the dielectric surface comprises $SiO_2$. In some embodiments, the metal surface comprises W.

In some embodiments, the first precursor is a silicon precursor. In some embodiments, the silicon precursor has the formula $Si(OR^I)_{4-x}R^{II}_x$, such that x=0 to 3, $R^I$ is alkyl with 1-5 carbons and $R^{II}$ is any ligand containing carbon and/or hydrogen and/or oxygen and all RI and RII groups can be selected independently. In some embodiments, $R^{II}$ has alkenyl, alkynyl, phenyl, carbonyl, aldehyde, ester, ether, carboxyl, peroxy or hydroperoxy functionalities and all $R^I$ and $R^{II}$ groups can be chosen independently from each other. In some embodiments, the first precursor is MPTMS.

In some embodiments, the plasma reactant comprises $Ar/H_2$ plasma. In some embodiments, the plasma reactant does not comprise oxygen species.

In some embodiments, the first precursor is MPTMS and the second reactant comprises $Ar/H_2$ plasma.

In some embodiments, methods of depositing a SiOC thin film on both a first dielectric surface of a substrate and a second metal surface of the same substrate comprise two or more deposition cycles in which the substrate is alternately and sequentially contacted with a first reactant comprising silicon and a second plasma reactant that does not comprise oxygen species. In some embodiments, the first reactant is MPTMS and the second reactant is plasma generated in $Ar/H_2$ gas. In some embodiments, the dielectric surface comprises $SiO_2$ and the metal surface comprises W.

In some embodiments, PEALD processes for depositing SiOC on a first surface of a substrate comprising $SiO_2$ and a second surface of the substrate comprising W are described. The PEALD process may comprise two or more deposition cycles comprising, in sequence: contacting the substrate with a first reactant comprising MPTMS; contacting the substrate with a purge gas; contacting the substrate with $Ar/H_2$ plasma; and again contacting the substrate with a purge gas. In some embodiments, the process additionally comprises contacting the substrate with a plasma reactant prior to the first deposition cycle. In some embodiments, the SiOC is deposited uniformly on the first and second surfaces.

DETAILED DESCRIPTION

Figure 1:
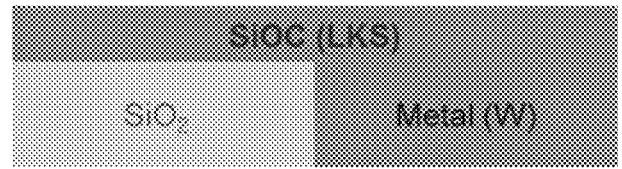
FIG. 1 is a schematic drawing of a uniform SiOC layer deposited on both dielectric and metal surfaces.

Silicon oxide carbide (SiOC) films, have a wide variety of applications, as will be apparent to the skilled artisan, for example in integrated circuit fabrication. In some aspects, SiOC films are deposited on two or more different surfaces, for example on a metal surface and a dielectric surface as illustrated in FIG. 1. In some embodiments the SiOC films are deposited on two or more different surfaces by a single deposition process. For example, a SiOC film can be deposited on two different surfaces of a substrate by a plasma-enhanced atomic layer deposition (PEALD) process. In some aspects, SiOC films having low etch rates, for example in HF or dilute HF, are deposited by oxygen-free PEALD processes on a first surface comprising a first material and a second surface comprising a second, different material. In some embodiments the processes use a Si-alkoxy-based precursor and plasma, such as $Ar/H_2$ plasma. The processes can be controlled to achieve uniform film deposition on a variety of different substrate surfaces.

According to some embodiments a SiOC film is deposited using a PEALD process comprising alternately contacting the substrate with a first silicon alkoxy precursor and a plasma reactant, such as $Ar/H_2$ plasma. The first precursor may contain both oxygen and silicon. The film grows on a first surface, such as a dielectric surface, and on a second different surface, such as a metal or metallic surface. Excess reactant and/or reaction byproducts may be removed from the substrate surfaces between contacting steps, such as by exposing the substrate to a purge gas.

In some embodiments a substrate is provided comprising a first surface, such as a dielectric surface, and second different surface, such as a metal surface. The substrate is alternately and sequentially contacted with a silicon precursor, such as a silicon alkoxy precursor, and a plasma reactant, such as $Ar/H_2$ plasma. The plasma and silicon precursor may be provided in pulses separated by a purge in which excess reactant and reaction byproducts, if any, are removed from the substrate surface. In some embodiments the first and second surface are contacted with a purge gas between pulses of the silicon reactant and the plasma.

In some embodiments a deposition process begins with a silicon reactant pulse, and the reaction sequence, or deposition cycle, may be repeated a desired number of times (A):

A×(silicon precursor pulse/purge/plasma pulse/purge)

In some embodiments the deposition cycle begins with a plasma pulse, which is followed by a silicon precursor pulse.

In some embodiments the deposition cycle is repeated until a uniform SiOC film is deposited on two or more different surfaces. In some embodiments the deposition cycle is repeated at least 100 times, at least 200 times, at least 300 times, at least 400 times, or at least 500 times. In some embodiments the deposition cycle is repeated at least 1000 times. The deposition cycle may be repeated until a film of a desired thickness has been formed on the two or more different surfaces.

By selecting specific process conditions, such as the nature of the reactants, the temperature, the pulse and purge times, the plasma power, and the number of deposition cycles, deposition on two or more different surfaces can be achieved with a desired level of uniformity. In some embodiments, the process conditions, such as plasma power, can be tuned such that growth proceeds uniformly on two or more different surfaces.

In some embodiments a film is considered to be uniformly deposited when it has a thickness that varies by less than 75%, less than 50%, less than 40%, less than 30%, less than 20%, less than 15%, less than 10%, less than 9%, less than 8%, less than 7%, less than 6%, less than 5%, less than 4%, less than 3%, less than 2% or even less than 1% between at least a first surface and a second different surface. In some embodiments thickness is measured as the average thickness of the film deposited on a particular surface. In some embodiments uniformity is measured as the actual thickness variation measured between two different surfaces.

In some embodiments the plasma reactant is hydrogen based. For example, the plasma may be generated in $H_2$ gas or a mixture of $H_2$ and a noble gas, such as Ar. In some embodiments the plasma is generated in a mixture of $H_2$ and Ar gas (referred to as $Ar/H_2$ plasma). In some embodiments the plasma is oxygen gas-free. That is, the plasma is generated in a gas or gas mixture that does not comprise oxygen.

In some embodiments plasma, for example hydrogen containing plasma, may be generated by applying RF power of from about 5 W to about 5000 W, 10 W to about 2000 W, from about 50 W to about 1000 W, or from about 100 W to about 500 W to a reactant gas or gas mixture. In some embodiments the RF power density may be from about 0.02 $W/cm^2$ to about 2.0 $W/cm^2$, or from about 0.05 $W/cm^2$ to about 1.5 $W/cm^2$. The RF power may be applied to a gas that flows during the plasma contacting time, that flows continuously through the reaction chamber, and/or that flows through a remote plasma generator. Thus in some embodiments the plasma is generated in situ, while in other embodiments the plasma is generated remotely. In some embodiments a showerhead reactor is utilized and plasma is generated between a susceptor (on top of which the substrate is located) and a showerhead plate.

In some embodiments the deposition rate is similar on both surfaces. In some embodiments the deposition rate differs between the two or more different surfaces. For example, in some embodiments there may be a longer incubation time on one of the surfaces relative to the other. In some embodiments the growth rate on one surface may be different than on the other surface. In some embodiments the deposition rate on one or more surfaces may change over time. For example, the deposition rate on one surface may increase while the deposition rate on a second surface remains constant.

In some embodiments deposition time can be selected to achieve deposition of a SiOC film of similar, relatively uniform thickness on two or more different surfaces, such as on both dielectric and metal surfaces of the same substrate.

In some embodiments the number of deposition cycles is selected to achieve deposition of a SiOC film of a similar, relatively uniform thickness on two or more different surfaces of a substrate.

In some embodiments the deposition process is carried out at a low processing temperature. In some embodiments the deposition temperature is less than about 500° C., less than about 400° C., less than about 300° C., less than about 200° C. or less than about 100° C. In some embodiments a SiOC film is deposited at a temperature of about 100° C. to about 300° C. In some embodiments a SiOC film is deposited at a temperature of about 150° C. to 250° C. In some embodiments a SiOC film is deposited at a temperature of about 200° C.

In some embodiments a SiOC film is deposited on two or more different surfaces comprising different materials in the same deposition process. In some embodiments a SiOC film is deposited uniformly on two or more different surfaces comprising two or more different materials, for example three or more different surfaces each comprising a different material, four or more different surfaces each comprising a different material etc. In some embodiments the two or more different surfaces are on the same substrate. In some embodiments the two or more surfaces are adjacent.

In some embodiments a SiOC film is deposited on all surfaces of a substrate.

In some embodiments, a SiOC film is deposited on two or more different surfaces, where the two or more different surfaces comprise, for example, metal, oxide, oxidized metal, native metal oxide, native $SiO_2$, Si, dielectric, $SiO_2$, and/or $Si_3N_4$.

In some embodiments a SiOC film is deposited on two different surfaces, where one of the surfaces is a dielectric material and the other surface comprises a metal or metallic material.

In some embodiments a dielectric surface may be, for example, a $SiO_2$ surface or a low-k surface. In some embodiments a dielectric material comprises one or more of $SiO_2$, SiN and poly Si. In some embodiments a dielectric material is $SiO_2$. In some embodiments a dielectric material is SiN. In some embodiments a dielectric material is poly-Si.

In some embodiments a SiOC film is deposited on both a first surface and a second, surface that comprises a different material from the first surface. For example, a SiOC film may be deposited on a first metal or metallic surface and a second dielectric surface. In some embodiments a SiOC film is deposited on a SiO$_2$ surface and a metal surface. In some embodiments a SiOC film is deposited on a SiO$_2$ surface and a W surface. In some embodiments a SiOC film is deposited on a SiO$_2$ surface and a TiN surface. In some embodiments a SiOC film is deposited on a W surface and a SiN surface. In some embodiments a SiOC film is deposited on a TiN surface and a SiN surface. In some embodiments a SiOC film is deposited on a W surface and a poly-Si surface. In some embodiment a SiOC film is deposited on a TiN surface and a poly-Si surface.

In some embodiments a SiOC film is deposited with good uniformity on both a first surface and a second surface that comprises a different material from the first surface. For example, a SiOC film may be deposited simultaneously and uniformly on a first metal or metallic surface and a second dielectric surface. In some embodiments a SiOC film is deposited uniformly on a SiO$_2$ surface and a metal surface. In some embodiments a SiOC film is deposited uniformly on a SiO$_2$ surface and a W surface. In some embodiments a SiOC film is deposited uniformly on a SiO$_2$ surface and a TiN surface. In some embodiments a SiOC film is deposited uniformly on a W surface and a SiN surface. In some embodiments a SiOC film is deposited uniformly on a TiN surface and a SiN surface. In some embodiments a SiOC film is deposited uniformly on a W surface and a poly-Si surface. In some embodiment a SiOC film is deposited uniformly on a TiN surface and a poly-Si surface.

Unless otherwise indicated, if a surface is referred to as a metal surface herein, it may be a metal surface or a metallic surface. In some embodiments the metal or metallic surface may comprise metal, metal oxides, and/or mixtures thereof. In some embodiments the metal or metallic surface may comprise surface oxidation. In some embodiments the metal or metallic material of a metal or metallic surface is electrically conductive with or without surface oxidation. In some embodiments a metal or a metallic surface comprises one or more transition metals. In some embodiments the metal or metallic surface comprises one or more of Al, Cu, Co, Ni, W, Nb, and Fe. In some embodiments a metal or metallic surface comprises W. In some embodiments a metal or metallic surface comprises one or more noble metals, such as Ru. In some embodiments a metal or metallic surface comprises a conductive metal oxide, nitride, carbide, boride, or combination thereof. In some embodiments the substrate may comprise a metal nitride, including, but not limited to TiN and/or TaN. In some embodiments the metal surface may comprise a metal carbide. In some embodiments the metal surface may comprise a metal chalcogenide.

The formula of the silicon oxycarbide films is generally referred to herein as SiOC for convenience and simplicity. As used herein, SiOC is not intended to limit, restrict, or define the bonding or chemical state, for example the oxidation state of any of Si, O, C and/or any other element in the film. Further, in some embodiments SiOC thin films may comprise one or more elements in addition to Si, O and C.

In some embodiments the SiOC may comprise from about 0% to about 30% carbon on an atomic basis. In some embodiments the SiOC films may comprise from about 0% to about 60% oxygen on an atomic basis. In some embodiments the SiOC films may comprise about 0% to about 50% silicon on an atomic basis.

In some embodiments the SiOC film has a low-k value. In some embodiments the SiOC film has a k value of less than 4.

In some embodiments the substrate on which deposition is desired, such as a semiconductor workpiece, is loaded into a reaction space or reactor. The reactor may be part of a cluster tool in which a variety of different processes in the formation of an integrated circuit are carried out. In some embodiments a flow-type reactor is utilized. In some embodiments a shower head type of reactor is utilized. In some embodiments, a space divided reactor is utilized. In some embodiments a high-volume manufacturing-capable single wafer ALD reactor is used. In other embodiments a batch reactor comprising multiple substrates is used. For embodiments in which batch ALD reactors are used, the number of substrates is in the range of 10 to 200, in the range of 50 to 150, or in the range of 100 to 130.

Examples of suitable reactors that may be used include commercially available equipment such as the F-120® reactor, F-450® reactor, Pulsar® reactors—such as the Pulsar® 2000 and the Pulsar® 3000—EmerALD® reactor and Advance® 400 Series reactors, available from ASM America, Inc of Phoenix, Ariz. and ASM Europe B.V., Almere, Netherlands. Other commercially available reactors include those from ASM Japan K.K (Tokyo, Japan) under the tradename Eagle® XP and XP8.

In some embodiments, if necessary or desired, one or more exposed surfaces of the substrate can be pre-treated to provide reactive sites to react with the first phase of the PEALD process. In some embodiments a separate pre-treatment step is not required. In some embodiments the substrate is pre-treated to provide a desired surface termination. In some embodiments one or more surfaces of the substrate is pre-treated with plasma. In some embodiments the two or more surfaces on which SiOC is to be deposited are pre-treated with plasma, for example with H plasma.

In some embodiments a metal or metallic surface is subject to a surface treatment prior to deposition. For example, a metal or metallic surface may be treated by exposure to a plasma. In some embodiments the metal or metallic surface may be treated with H plasma prior to deposition. In some embodiments a W surface is treated with H plasma prior to deposition.

In some embodiments the substrate is contacted with a first silicon precursor and a second plasma reactant. In some embodiments the deposition process is halogen free. In some embodiments the deposition process is oxygen free.

In some embodiments the silicon precursor has the formula (1.):

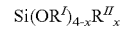

Where x=0 to 3, $R^I$ is alkyl with 1-5 carbons and $R^{II}$ is any ligand containing carbon and/or hydrogen and/or oxygen. $R^{II}$ can have, for example, alkenyl, alkynyl, phenyl, carbonyl, aldehyde, ester, ether, carboxyl, peroxy or hydroperoxy functionalities. All $R^I$ and $R^{II}$ groups can be chosen independently from each other.

In some embodiments the silicon precursor is MPTMS. In the example compound MPTMS, $R^I$ is methyl, $R^{II}$ is 3-methoxypropyl, and x is 1.

As mentioned above, in some embodiments the PEALD processes do not comprise oxygen plasma or plasma comprising oxygen species.

In some embodiments, for forming SiOC films, each PEALD cycle comprises at least two distinct phases. The contacting and removal of a reactant from the substrate may be considered a phase.

In a first phase, a vapor phase first reactant comprising silicon contacts the substrate and forms no more than about one monolayer on the surface on which deposition is desired. This reactant is also referred to herein as "the silicon precursor," "silicon-containing precursor," or "silicon reactant" and may be, for example, 3-methoxypropyltrimethoxysilane (MPTMS). In some embodiments the first reactant comprises both silicon and oxygen.

In a second phase, a second reactant comprising a reactive species contacts the substrate surfaces and may convert adsorbed silicon to SiOC on the dielectric surface. As discussed above, in some embodiments the second reactant comprises a hydrogen plasma, such as a $H_2$/Ar plasma.

In some embodiments a gas that is used to form a plasma may flow constantly throughout the deposition process but only be activated intermittently.

In some embodiments a gas that is used to form a plasma does not comprise oxygen. In some embodiments the adsorbed silicon precursor is not contacted with a reactive species generated by a plasma from oxygen. In some embodiments a second reactant comprising reactive species is generated in a gas that does not comprise oxygen. For example in some embodiments a second reactant may comprise a plasma generated in a gas that does not comprise oxygen. In some embodiments the second reactant may be generated in a gas comprising less than about 1 atomic % (at %) oxygen, less than about 0.1 at % oxygen, less than about 0.01 at % oxygen, or less than about 0.001 at % oxygen.

Additional phases may be added and phases may be removed as desired to adjust the composition of the final film.

In some embodiments for depositing a SiOC film, one or more deposition cycles begin by contacting the substrate with the silicon precursor, followed by the second plasma reactant. In other embodiments deposition may begin by contacting the substrate with the second plasma reactant, followed by the silicon precursor.

Excess reactant and reaction byproducts, if any, are removed from the vicinity of the substrate, and in particular from the substrate surface, between reactant contacting phases. In some embodiments excess reactant and reaction byproducts, if any, are removed from the substrate surface by, for example, purging the reaction chamber between reactant contacting phases, such as by purging with an inert gas. The flow rate and contacting time of each reactant is tunable, as is the removal step, allowing for control of the quality and various properties of the films.

The deposition cycle is repeated until a SiOC film of the desired thickness is obtained on the desired surfaces. In some embodiments the deposition parameters, such as the precursor flow rate, contacting time, removal time, and/or reactants themselves, may be varied in one or more deposition cycles during the PEALD process in order to obtain a film with the desired characteristics on two or more different surfaces.

In some embodiments the second plasma reactant is provided in two or more distinct pulses, without introducing another reactant in between any of the two or more pulses. For example, in some embodiments a plasma is provided in two or more sequential pulses, without introducing a Si-precursor in between the sequential plasma pulses. In some embodiments during provision of plasma two or more sequential plasma pulses are generated by providing a plasma discharge for a first period of time, extinguishing the plasma discharge for a second period of time, for example from about 0.1 seconds to about 10 seconds, from about 0.5 seconds to about 5 seconds or about 1.0 seconds to about 4.0 seconds, and exciting it again for a third period of time before introduction of another precursor or a removal step, such as before the Si-precursor or a purge step. Additional pulses of plasma can be introduced in the same way. In some embodiments a plasma is ignited for an equivalent period of time in each of the pulses.

In some embodiments removing excess reactant and reaction byproducts, if any, may comprise purging the reaction chamber. In some embodiments the reaction chamber may be purged by stopping the flow of the second reactant while continuing to flow a carrier gas or purge gas for a sufficient time to diffuse or purge excess reactants and reactant byproducts, if any, from the reaction space. In some embodiments the excess second precursor is purged with the aid of inert gas, such as nitrogen or argon, which is flowing throughout the PEALD cycle. In some embodiments the substrate may be moved from the reaction space containing the second reactant to a different reaction space. The removal may, in some embodiments, be from about 0.1 seconds to about 10 seconds, about 0.1 seconds to about 4 seconds or about 0.1 seconds to about 0.5 seconds. Together, the reactive species contacting and removal represent a second, reactive species phase in a SiOC atomic layer deposition cycle.

According to some embodiments of the present disclosure, the pressure of the reaction chamber during processing is maintained at from about 0.01 Torr to about 50 Torr, or from about 0.1 Torr to about 10 Torr. In some embodiments the pressure of the reaction chamber is greater than about 6 Torr, or about 20 Torr.

According to some embodiments a SiOC thin film is deposited on two or more different surfaces of a substrate in a reaction space by a PEALD deposition process comprising at least one cycle comprising:

contacting the substrate with a silicon reactant such that silicon species adsorb onto the surfaces of the substrate;

removing excess silicon reactant and reaction byproducts, if any, from the substrate surface;

contacting the substrate with a second reactant comprising reactive species generated by plasma;

removing excess second reactant and reaction byproducts, if any, from the substrate surface; and optionally repeating the contacting and removing steps to form a SiOC thin film of a desired thickness and composition on two or more different surfaces.

EXAMPLES

Figure 2:
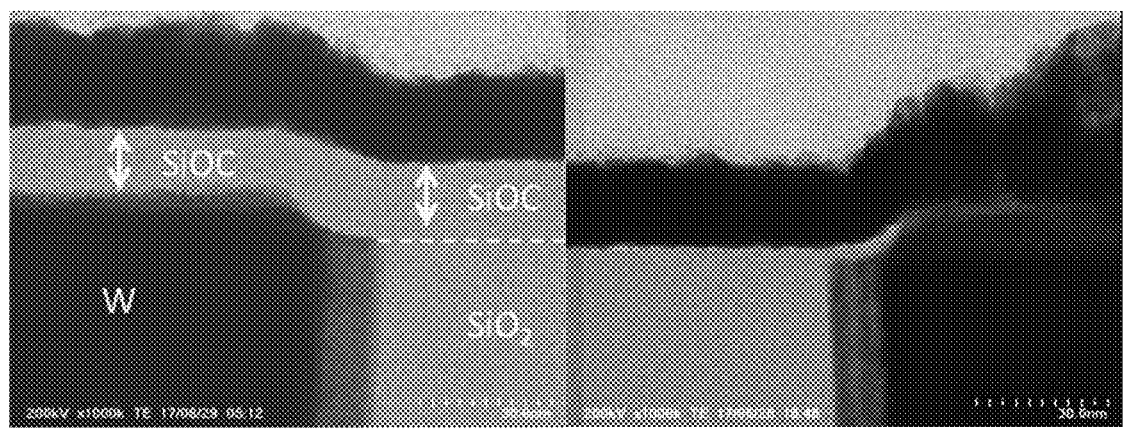
FIG. 2 is an STEM of SiOC film deposited on W and $SiO_2$ pattern at 200° C. and 200 W. The left panel shows the film after 1000 deposition cycles. The right panel shows the film after 500 deposition cycles.

A direct plasma PEALD reactor was used to deposit SiOC films by PEALD using 3-Methoxypropyl(trimethoxysilane) (MPTMS) as the silicon precursor. No heating of the precursor to produce vapor-phase reactant was required due to high enough vapor pressure of the compound. Experiments were carried out at a deposition temperature of 200° C. The growth rate per cycle (GPC) of the process was typically –0.2 Å/c. FIG. 2 shows SEM images of SiOC films deposited at 200° C. on a substrate comprising adjacent horizontal surfaces of W and SiO2.

As shown in the FIG. 2, right frame, after 500 cycles, SiOC film deposited was deposited on the $SiO_2$ surface while almost no deposition was observed on the adjacent W surface. However, after a longer deposition time as shown in FIG. 2, left frame, specifically 1000 cycles, SiOC was deposited to a similar extent on both the W and the $SiO_2$ surface. While some difference in the thickness of the SiOC layer can be observed between the W and $SiO_2$ surfaces, the thickness difference is expected to diminish with even longer deposition. The results observed indicate that there was a longer incubation time for SiOC deposition on the W surface than on $SiO_2$ surface.

Figure 3:
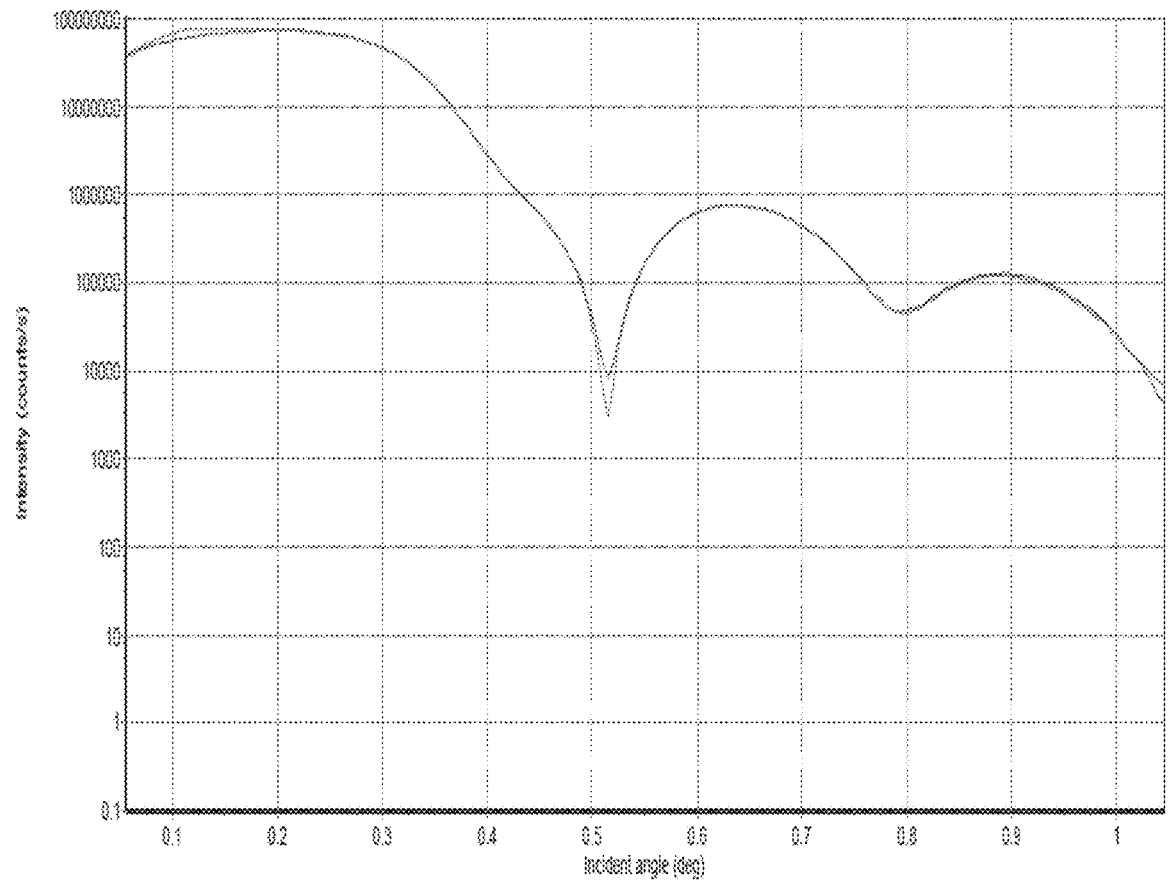
FIG. 3 shows XRR spectra of MPTMS related SiOC deposited on a 12 nm PVD TiN metallic surface after 500 deposition cycles.

FIG. 3 shows that around 6.2 nm of SiOC film was deposited on a TiN surface using MPTMS as the silicon precursor after 500 cycles, which indicates a slightly lower growth per cycle than that observed on native oxide surfaces.

What is claimed is:

1. A plasma enhanced atomic layer deposition (PEALD) process for depositing SiOC on two or more different surfaces of a substrate comprising:
   providing a substrate comprising a first surface and a second surface, wherein the first surface comprises a different material from the second surface, and wherein the first surface is a metal surface and the second surface is a dielectric surface;
   conducting two or more deposition cycles comprising alternately and sequentially contacting the first and second surfaces of the substrate with a first precursor comprising silicon and a second plasma reactant.

2. The method of claim 1, wherein the dielectric surface comprises $SiO_2$.

3. The method of claim 1, wherein the metal surface comprises W.

4. The method of claim 1, wherein the plasma reactant comprises $Ar/H_2$ plasma.

5. The method of claim 1, wherein the plasma reactant does not comprise oxygen species.

6. The method of claim 1, wherein the first precursor is a silicon precursor.

7. The method of claim 1, wherein the silicon precursor has the formula $Si(OR^I)_{4-x}R^{II}_x$, wherein x=0 to 3, $R^I$ is alkyl with 1-5 carbons and $R^{II}$ is any ligand containing carbon and/or hydrogen and/or oxygen and all RI and RII groups can be selected independently.

8. The method of claim 7, wherein $R^{II}$ has alkenyl, alkynyl, phenyl, carbonyl, aldehyde, ester, ether, carboxyl, peroxy or hydroperoxy functionalities, and wherein all $R^I$ and $R^{II}$ groups can be chosen independently from each other.

9. The method of claim 7, wherein the first precursor is MPTMS.

10. The method of claim 1, wherein first precursor is MPTMS and the second reactant comprises $Ar/H_2$ plasma.

11. The method of claim 1, additionally comprising contacting the substrate with a plasma reactant prior to beginning the deposition cycle.

12. The method of claim 1, wherein the SiOC film is deposited uniformly on the first surface and second surface.

13. The method of claim 1, wherein the deposition cycle is repeated more than 500 times.

14. The method of claim 1, wherein the SiOC film has a k value of less than 4.

15. A method of depositing a SiOC thin film on both a first dielectric surface of a substrate and a second metal surface of the same substrate comprising two or more deposition cycles comprising alternately and sequentially contacting the substrate with a first reactant comprising silicon and a second plasma reactant that does not comprise oxygen species.

16. The method of claim 15, wherein the first reactant is MPTMS and the second reactant is plasma generated in $Ar/H_2$ gas.

17. The method of claim 15, wherein the dielectric surface comprises $SiO_2$ and the metal surface comprises W.

18. A plasma enhanced atomic layer deposition (PEALD) process for depositing SiOC on a first surface of a substrate comprising $SiO_2$ and a second surface of the substrate comprising W, the process comprising two or deposition cycles comprising in sequence:
   contacting the substrate with a first reactant comprising MPTMS;
   contacting the substrate with a purge gas;
   contacting the substrate with $Ar/H_2$ plasma; and
   contacting the substrate with a purge gas.

19. The method of claim 18, additionally comprising contacting the substrate with a plasma reactant prior to the first deposition cycle.

20. The method of claim 18, wherein the SiOC is deposited uniformly on the first and second surfaces.

* * * * *

UNITED STATES PATENT AND TRADEMARK OFFICE
CERTIFICATE OF CORRECTION

PATENT NO. : 10,991,573 B2
APPLICATION NO. : 16/208350
DATED : April 27, 2021
INVENTOR(S) : Lingyun Jia Page 1 of 2

It is certified that error appears in the above-identified patent and that said Letters Patent is hereby corrected as shown below:

On the Title Page

On Page 2, Column 1, Item (56), Line 2, under U.S. Patent Documents, delete "Kü̇yel" and insert --Küyel--.

On Page 4, Column 1, Item (56), Line 2, under Other Publications, delete "transconductant" and insert --transconductance--.

On Page 4, Column 2, Item (56), Line 5, under Other Publications, delete "Zeitscrift" and insert --Zeitschrift--.

On Page 4, Column 2, Item (56), Line 54, under Other Publications, delete "Al203" and insert --$Al_2O_3$--.

On Page 5, Column 1, Item (56), Line 5, under Other Publications, delete "HN3" and insert --$NH_3$--.

On Page 5, Column 2, Item (56), Line 47, under Other Publications, delete "triethoxylsilyl" and insert --triethoxysilyl--.

On Page 5, Column 2, Item (56), Line 50, under Other Publications, delete "bis(triethoxysilypethane" and insert --bis(triethoxysilyl)ethane--.

In the Specification

In Column 6, Line 20, delete "K.K" and insert --K.K.--.

In Column 8, Line 53, delete "-0.2" and insert --~0.2--.

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*

In the Claims

In Column 10, Claim 18, Line 27, delete "two or" and insert --two or more--.